(12) United States Patent
Bayan et al.

(10) Patent No.: US 7,923,825 B2
(45) Date of Patent: Apr. 12, 2011

(54) INTEGRATED CIRCUIT PACKAGE

(75) Inventors: Jaime A. Bayan, San Francisco, CA (US); Anindya Poddar, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 100 days.

(21) Appl. No.: 12/553,919

(22) Filed: Sep. 3, 2009

(65) Prior Publication Data

US 2010/0025818 A1 Feb. 4, 2010

Related U.S. Application Data

(63) Continuation of application No. 11/963,388, filed on Dec. 21, 2007, now Pat. No. 7,612,435.

(51) Int. Cl.
*H01L 23/495* (2006.01)

(52) U.S. Cl. . 257/672; 257/666; 257/673; 257/E23.031; 257/E23.042; 257/E23.043

(58) Field of Classification Search .......... 257/666–677, 257/E23.031–E23.059

See application file for complete search history.

(56) References Cited

U.S. PATENT DOCUMENTS

| | | | |
|---|---|---|---|
| 5,530,282 A | 6/1996 | Tsuji | |
| 6,781,243 B1 * | 8/2004 | Li et al. | 257/777 |
| 7,102,209 B1 * | 9/2006 | Bayan et al. | 257/666 |
| 2007/0132075 A1 * | 6/2007 | Masumoto | 257/676 |

* cited by examiner

*Primary Examiner* — N Drew Richards
*Assistant Examiner* — Yu-Hsi Sun
(74) *Attorney, Agent, or Firm* — Heyer Law Group LLP

(57) ABSTRACT

An integrated circuit package is described that includes an integrated circuit die, a plurality of lower contact leads, and an insulating substrate positioned over the die and lower contact leads. The insulating substrate includes a plurality of electrically conducting upper routing traces formed on the bottom surface of the substrate. The traces on the bottom surface of the substrate electrically couple each lower contact lead with an associated I/O pad.

15 Claims, 10 Drawing Sheets

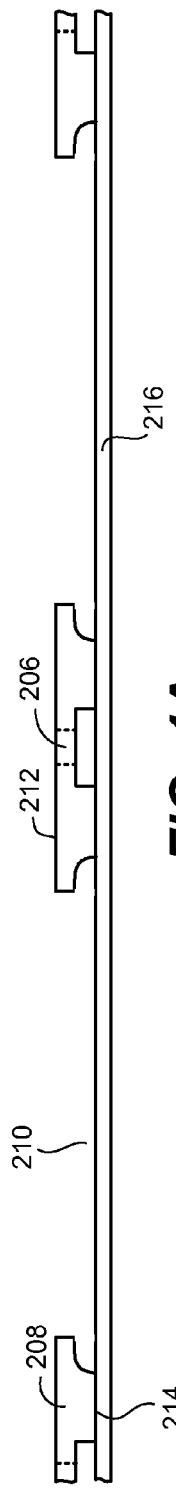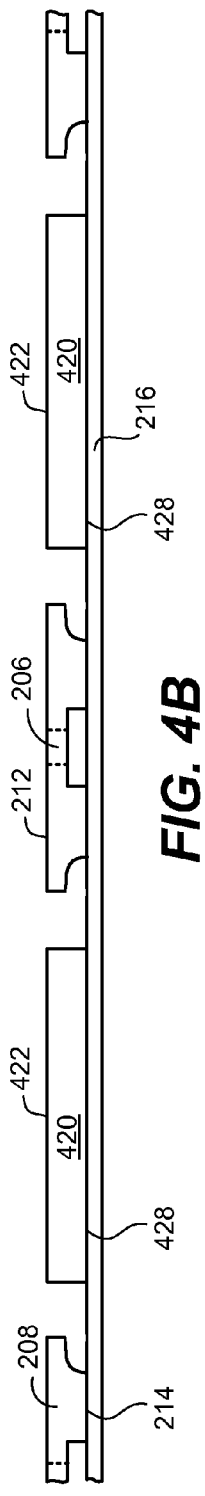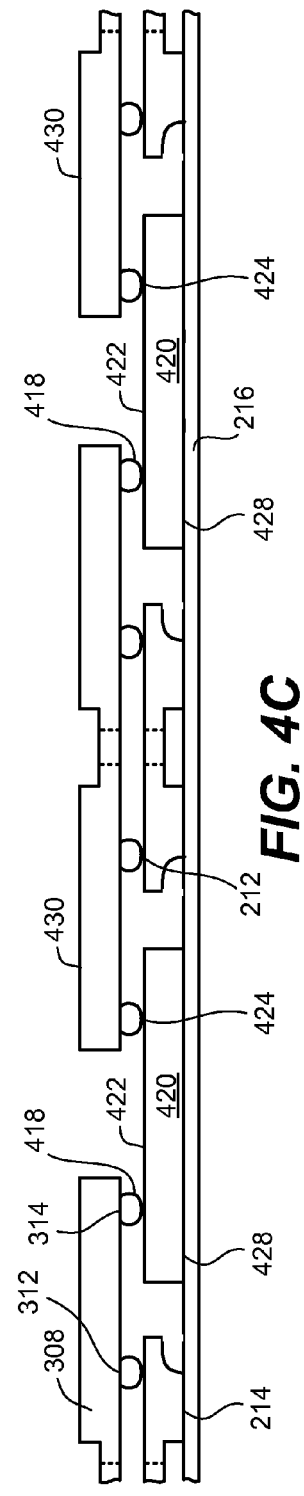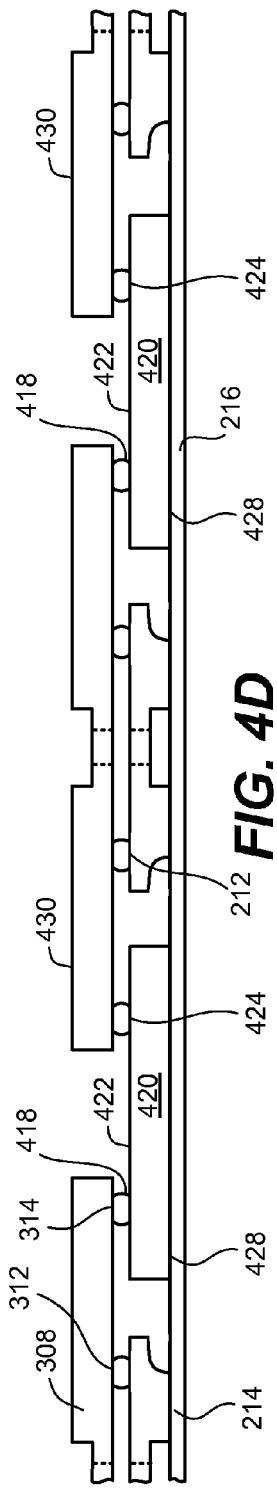

INTEGRATED CIRCUIT PACKAGE

CROSS REFERENCE TO RELATED APPLICATION

This application is a Continuation of and claims priority to U.S. patent application Ser. No. 11/963,388, filed on Dec. 21, 2007 and entitled "Method of Packaging Integrated Circuits," which is incorporated herein in its entirety for all purposes.

TECHNICAL FIELD

The present invention relates generally to the packaging of integrated circuits (ICs). More particularly, an improved method is described for packaging IC dice.

BACKGROUND OF THE INVENTION

There are a number of conventional processes for packaging integrated circuit (IC) dice. By way of example, many IC packages utilize a metallic leadframe that has been stamped or etched from a metal sheet to provide electrical interconnects to external devices. The die may be electrically connected to the leadframe by means of bonding wires, solder bumps or other suitable electrical connections. In general, the die and portions of the leadframe are encapsulated with a molding material to protect the delicate electrical components on the active side of the die while leaving selected portions of the leadframe exposed to facilitate electrical connection to external devices.

Increasing heat dissipation out of an IC die generally results in greater device performance and stability. As such, it is desirable in many applications to utilize solder bumps to electrically connect the die to the leadframe as there is, in general, considerable more heat dissipation possible through a solder bump as compared with typically much narrower and longer bonding wires. However, the use of solder bumps to connect an IC die to a leadframe has thus far been somewhat limited in use to packages having lower pin counts and/or leads that extend externally from the package.

While existing arrangements and methods for packaging IC devices work well, there are continuing efforts to both miniaturize the size of IC devices and improve the thermal performance of IC devices.

SUMMARY OF THE INVENTION

In one aspect, an integrated circuit package is described that includes an integrated circuit die, a plurality of lower contact leads, and an insulating substrate positioned over the die and lower contact leads. The insulating substrate includes a plurality of electrically conducting upper routing traces formed on the bottom surface of the substrate. The traces on the bottom surface of the substrate electrically couple each lower contact lead with an associated I/O pad.

BRIEF DESCRIPTION OF THE DRAWINGS

For a better understanding of the invention, reference should be made to the following detailed description taken in conjunction with the accompanying drawings, in which:

FIGS. 4A-D illustrate diagrammatic cross-sectional side views of the leadframe panels of FIGS. 2 and 3 at various steps in the process of FIG. 1 in accordance with embodiments of the present invention;

Like reference numerals refer to corresponding parts throughout the drawings.

DETAILED DESCRIPTION OF EXAMPLE EMBODIMENTS

The present invention relates generally to the packaging of integrated circuits (ICs). More particularly, an improved method is described for packaging IC dice.

In the following description, numerous specific details are set forth to provide a thorough understanding of the present invention. It will be apparent, however, to one skilled in the art that the present invention may be practiced without some or all of these specific details. In other instances, well known process steps have not been described in detail in order to avoid unnecessary obscuring of the present invention.

The following description focuses on the utilization of an interconnect structure in the packaging of IC die. The interconnect structure serves to electrically connect input/output (I/O) pads on the active surface of the die to associated solder pad surfaces on a leadframe, which in turn serves to electrically connect the package with a printed circuit board (PCB) or other desired substrate. In various embodiments, the interconnect substrate may take the form of a structure substantially similar to a leadframe or leadframe panel. Various embodiments of the present invention will be described with reference to FIGS. 1-9.

Figure 1:
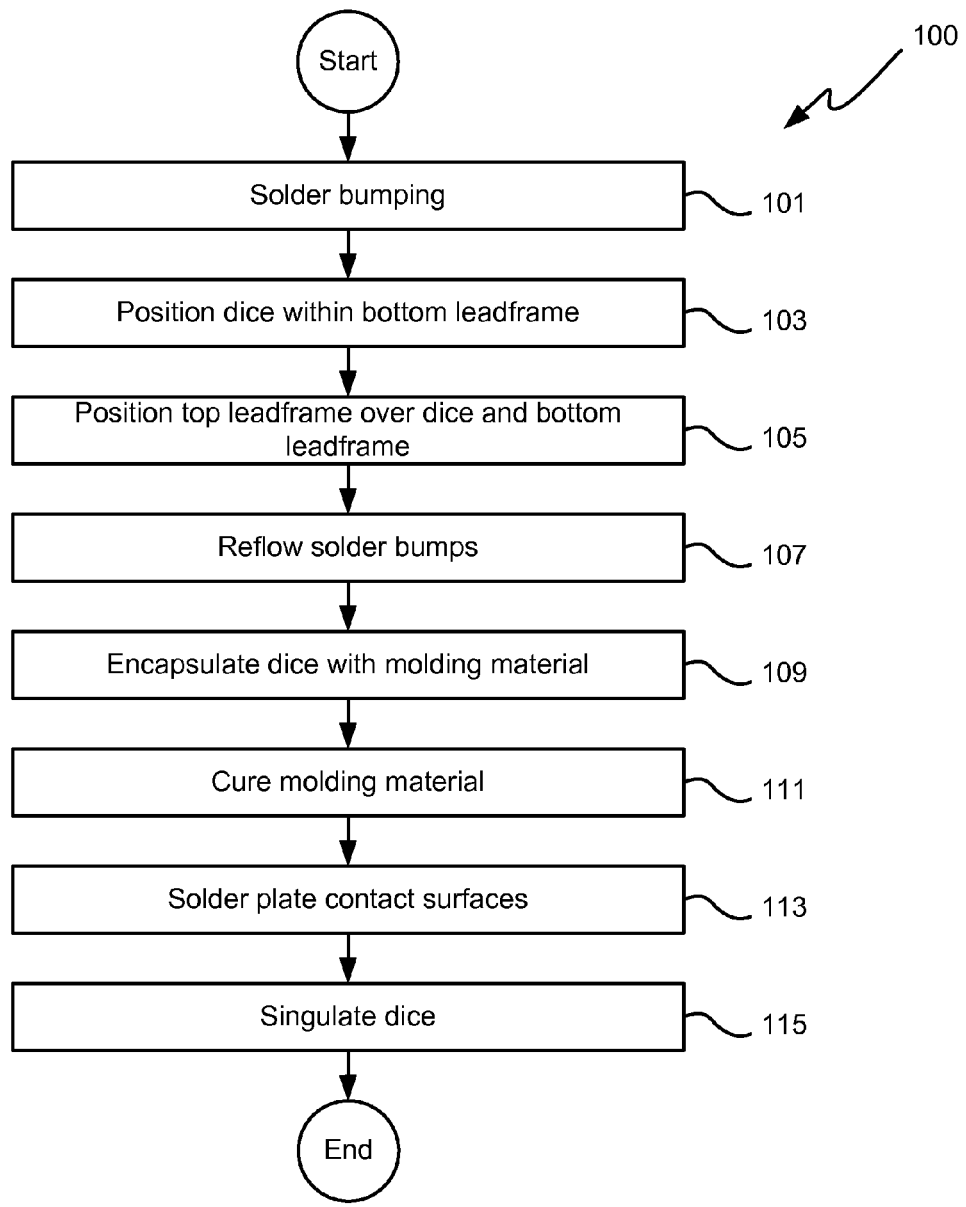
FIG. 1 is a flow chart illustrating a process for preparing and packaging IC dice in accordance with an embodiment of the present invention.
Figure 2A:
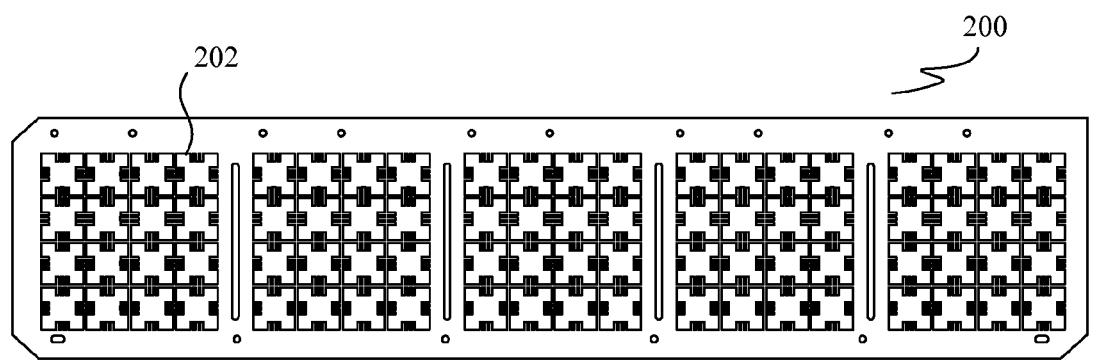
FIGS. 2A-C illustrate diagrammatic top views of a first leadframe panel suitable for use in packaging IC dice in accordance with an embodiment of the present invention.
Figure 2B:
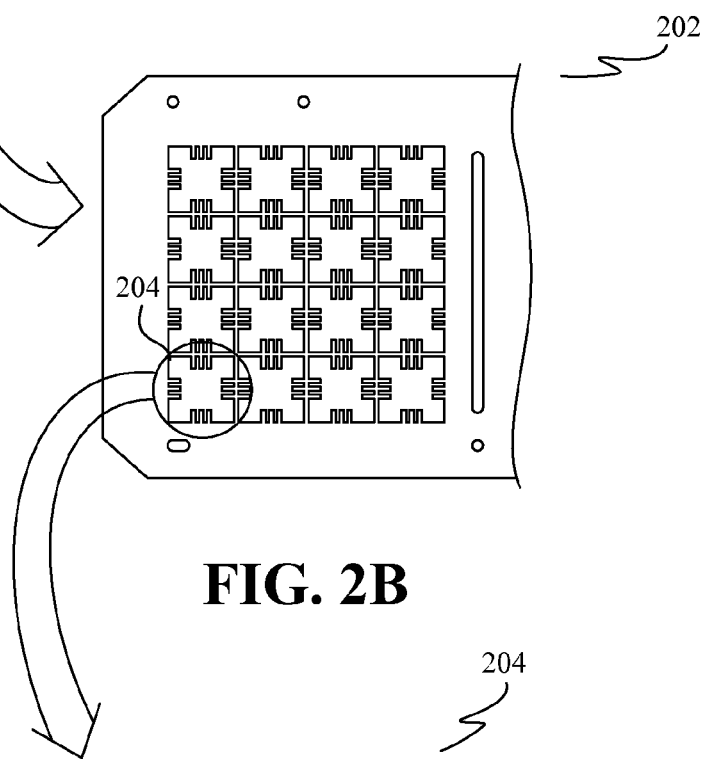
Figure 2C:
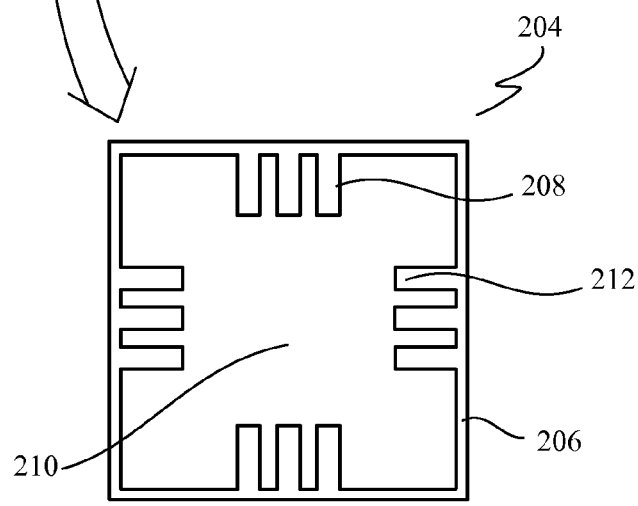

Referring initially to FIG. 1, and further in view of FIGS. 2-5, a process 100 of preparing and packaging IC dice in accordance with particular embodiments of the present invention will be described. Initially, a first leadframe 200 is fabricated. With respect to FIGS. 2A-C, an exemplary leadframe panel 200 suitable for use in packaging integrated circuits according to various embodiments of the present invention will be described. FIG. 2A illustrates a diagrammatic top view of a leadframe panel 200 arranged in the form of a strip. The leadframe panel 200 can be configured as a metallic structure having a number of two-dimensional arrays 202 of device areas. By way of example, leadframe panel 200 may be formed from copper or a suitable copper alloy. As illustrated in the successively more detailed FIGS. 2B-C, each two-dimensional array 202 includes a plurality of device areas 204, each configured for use in a single IC package, and each connected by fine tie bars 206.

Each device area 204 includes a number of leads 208, each supported at one end by the tie bars 206. In the illustrated embodiment, each device area includes twelve leads 208, three of which extend from each of four sides of a die attach area 210. Each lead 208 includes a conductive solder pad surface 212 on the top surface of the leadframe and a package contact surface 214 on the bottom (back) surface of the leadframe. The leads 208 may be etched, half-etched, or otherwise thinned relative to the package contact surfaces, so as to provide electrical connection to contacts on a PCB while limiting the exposed conductive areas on the bottom surface of the leadframe. Additionally, as illustrated in FIG. 4A, the tie bar regions 206 (illustrated with dotted lines) are generally half-etched so as to reduce the amount of metal material that must be sacrificed during package singulation. In some embodiments, it may also be desirable to etch or otherwise thin the top surface of the leadframe as well. An adhesive tape 216 is attached to the bottom surface of the leadframe panel 200. The tape 216 provides structural support for the leadframe features and additionally serves to support dice positioned within the die attach areas 210 of the leadframe panel 200.

Figure 3A:
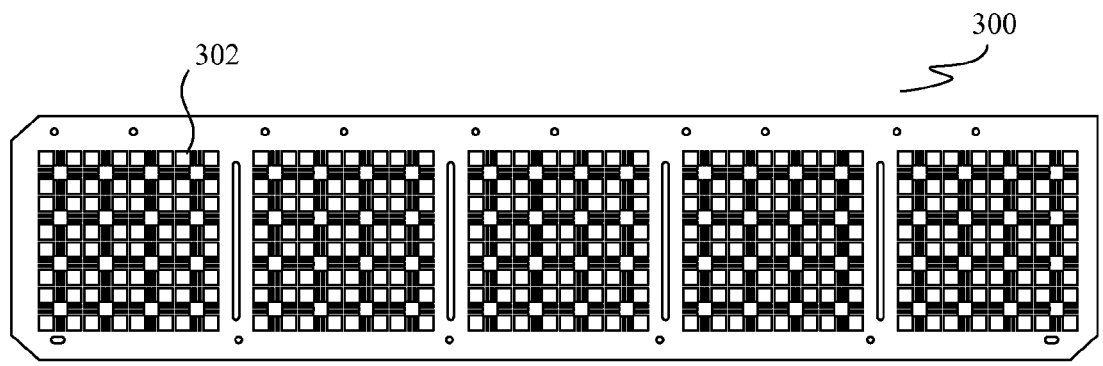
FIGS. 3A-C illustrate diagrammatic top views of a second leadframe panel suitable for use in packaging IC dice in accordance with an embodiment of the present invention.
Figure 3B:
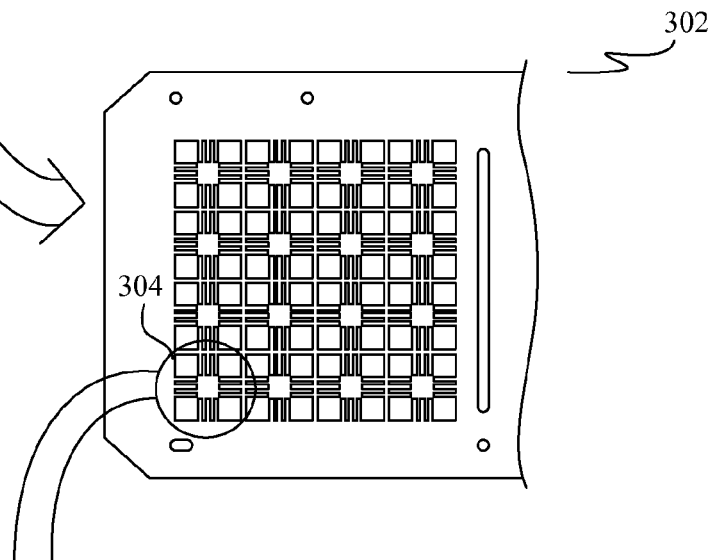
Figure 3C:
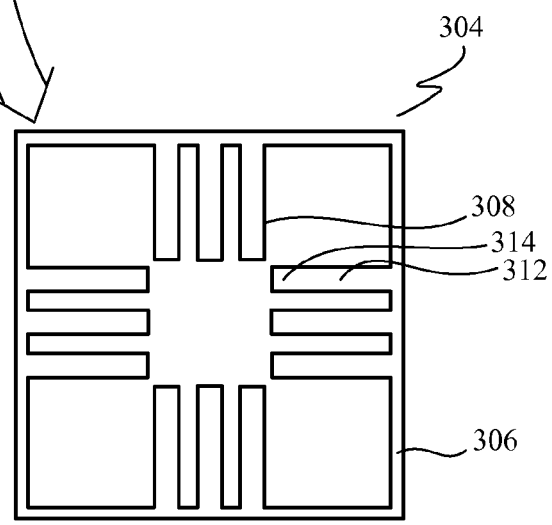

A second leadframe panel 300 is also fabricated. In various embodiments, leadframe panel 300 is substantially similar to leadframe panel 200. By way of example, with respect to FIGS. 3A-C, an exemplary leadframe panel 300 suitable for use in packaging integrated circuits according to various embodiments of the present invention will be described. FIG. 3A illustrates a diagrammatic top view of a leadframe panel 300 arranged in the form of a metallic strip having a number of two-dimensional arrays 302 of device areas 304, each configured for use in a single IC package, and each connected by fine tie bars 306.

Each device area 304 has substantially the same footprint as each device area 204 and also includes a number of leads 308, each supported at one end by the tie bars 306. In the illustrated embodiment, each device area includes twelve leads 308 arranged in a similar fashion to the leads 208 of leadframe panel 200. One notable difference, however, is that the leads 308 are considerably longer than the leads 208. Each lead 308 includes two conductive solder pad surfaces 312 and 314 on the top surface of the leadframe. The leads 308 may also be etched, half-etched, or otherwise thinned. By way of example, portions of the tie bars 306 may be half-etched so as to limit the amount of metal material that must be sacrificed during package singulation. In some embodiments, leadframe panel 300 also includes an adhesive tape attached to its back surface.

It will be appreciated by those skilled in the art that, although specific leadframe panels 200 and 300 have been described and illustrated, the described methods may be applied in packaging dice utilizing an extremely wide variety of other leadframe panel or strip configurations as well as other substrates, some of which will be described in more detail below. Thus, although the following description of particular embodiments describes the packaging of dice utilizing specific leadframe technology, those of skill in the art will understand that embodiments of the present invention may also be practiced using an extremely wide variety of leadframe and other substrate configurations. Additionally, although described with references to top and bottom surfaces of the leadframe panels 200 and 300, it should be appreciated that this context is intended solely for use in describing the structure and in no way defines or limits the orientation of the leadframe relative to other package components.

In one embodiment, solder bumps 418 are formed at step 101 onto the solder pad surfaces 312 and 314. The solder pad surfaces 312 and 314 may be solder-bumped with any suitable means. By way of example, a solder paste may be screen printed onto the solder pad surfaces 312 and 314. In another embodiment, the solder pad surfaces 312 and 314 may be fluxed and bumped with solder balls.

Figure 5A:
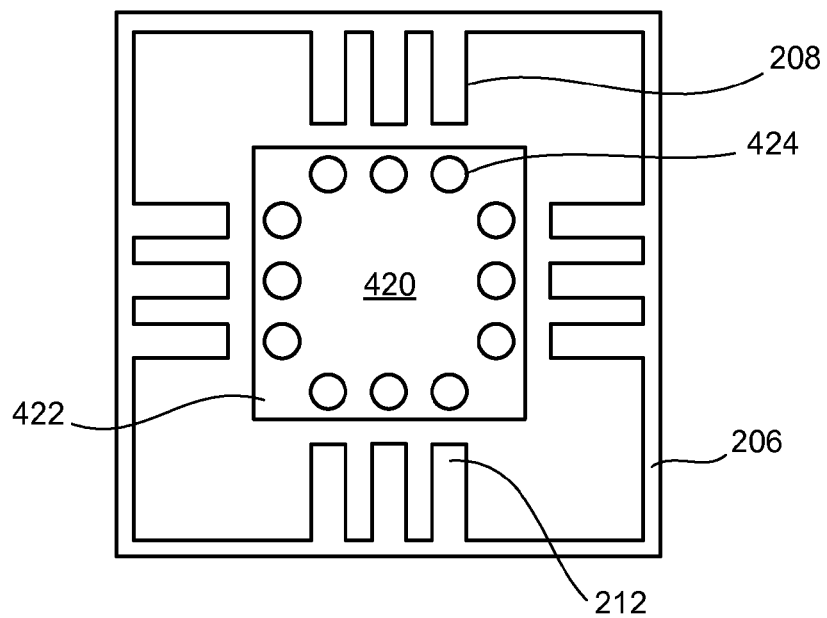
FIGS. 5A-B illustrate close-up top views of the device areas of FIGS. 2C and 3C during packaging of an IC die in accordance with an embodiment of the present invention.

At 103, a multiplicity of IC dice 420 are positioned into corresponding die attach areas 210 of the leadframe panel 200 as illustrated in FIGS. 4B and 5A. Each die 420 has an active surface 422 that includes a number of I/O pads 424. The I/O pads 424 may be the original I/O pads on the active surface 422 of the die 420 or other I/O pads that have been redistributed from original I/O pads using various redistribution techniques (hereinafter, bond pads will be used interchangeably with I/O pads). Additionally, in various embodiments, under-bump metallizations (UBMs) may be formed on the I/O pads 424.

In an alternate embodiment, solder bumps 418 may be formed on the I/O pads 424 (over the UBMs if present) rather than or in addition to the inner solder pad surfaces 314. Additionally, solder bumps 418 may also be formed on the solder pad surfaces 212 rather than or in addition to the outer solder pad surfaces 312. However, by solder bumping the leadframe panel 300, only a single solder bumping step is required, whereas in other embodiments the leadframe panel 200 and the dice 420 (presumably at the wafer level) would be solder bumped independently.

Figure 5B:
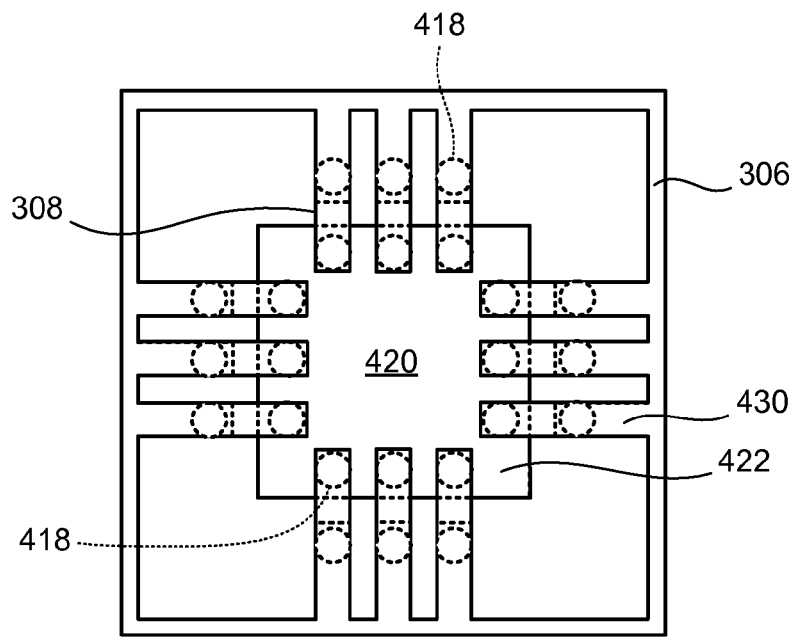

At 105, leadframe panel 300 is inverted (if necessary) and positioned over leadframe panel 200, as illustrated in FIGS. 4C and 5B. The leadframe panel 300 is positioned such that the solder pad surfaces 312 are positioned adjacent corresponding solder pad surfaces 212 and such that solder pad surfaces 314 are positioned adjacent corresponding I/O pads 424. Here it should be noted that in one embodiment, each solder pad surface 212 on a lead 208 is approximately coplanar with the I/O pads 424 on the active surface 422 of the die 420. At 107 the solder bumps 418 are reflowed to form solder joints 418 that physically and electrically connect the solder pad surfaces 312 and 314 to the corresponding solder pad surfaces 212 and the I/O pads 424 as illustrated in FIG. 4D. In this way, the leads 308 serve as routing elements that electrically couple the I/O pads 424 with associated leads 208. At this point, the tape (if present) on the back surface of the leadframe panel 300 may be removed.

At 109 the solder joints 418 and portions of the dice 420 and leadframe panels 200 and 300 are encapsulated with a molding material (compound) 426. The molding compound is generally a non-conductive plastic or resin having a low coefficient of thermal expansion. In a preferred embodiment, the entire populated leadframe panels 200 and 300 are placed in the mold and encapsulated substantially simultaneously. By way of example, the mold may be configured such that each two-dimensional array 202 and corresponding array 302 is encapsulated as a single unit. However, it should be appreciated that a lesser number of dice 420 may also be encapsulated at any one time.

It should additionally be appreciated that virtually any molding system may be used to encapsulate the attached dice 420 and leadframe panels 200 and 300. By way of example, a film assisted molding (FAM) system may be used to encapsulate the attached dice 420. The adhesive film 216 prevents molding compound intrusion over the back surfaces 428 of the dice 420 and the package contact surfaces 214 on the bottom surfaces of the leads 208. In some embodiments, the back surface 430 of the leadframe panel 300 is also encapsulated with molding material 426. In other embodiments, it may be desirable to leave portions of the back surface 430 exposed and unencapsulated with molding material 426. By way of example, it may be desirable to leave the back surface 430 exposed to increase the thermal dissipation out of an encapsulated die 420.

Subsequently, at 111 the molding compound 426 may be cured in a heated oven if the molding compound is a thermosetting plastic and the tape 216 may be removed. After curing the molding compound 426, the package contact surfaces 214 may be solder plated at 113 to facilitate contact to corresponding contact surfaces on a PCB or other substrate. In some embodiments, the back surfaces 428 of the dice are also solder plated to facilitate external connection to the PCB.

Figure 6A:
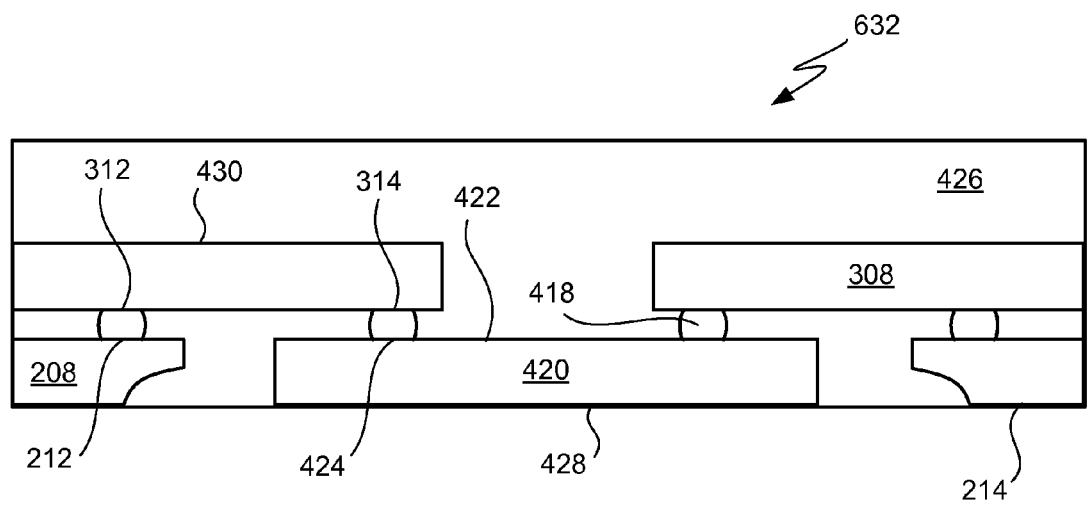
FIGS. 6A-B illustrate a diagrammatic cross-sectional side view and a diagrammatic bottom view of the IC package produced by the process of FIG. 1 in accordance with an embodiment of the present invention.
Figure 6B:
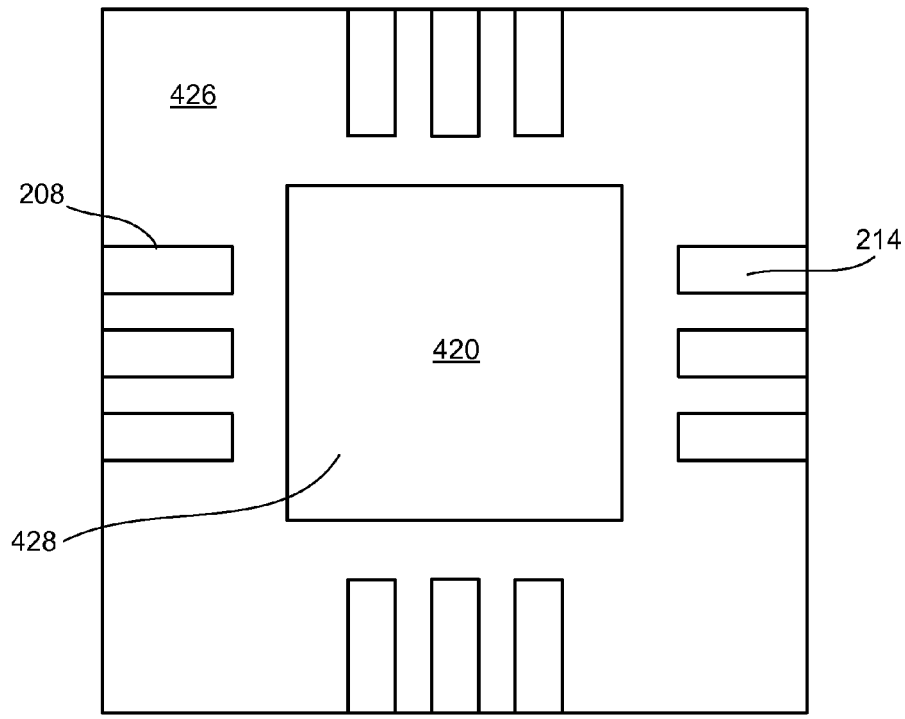

The encapsulated leadframe panels 200 and 300 may then be singulated at 115 to yield a multiplicity of individual IC packages 632, as illustrated in FIGS. 6A and B, which illustrate a diagrammatic cross-sectional side view and a bottom view, respectively, of an IC package 632. The encapsulated leadframe panels 200 and 300 may be singulated with any suitable means. By way of example, the leadframe panels 200 and 300 may be singulated using sawing, gang-cutting (sawing), laser cutting or plasma cutting along the tie bars 206 and 306 to produce individual IC packages 632. Upon package singulation, the IC packages 632 may inspected and/or tested before being attached to PCBs or other substrates. Those of skill in the art will recognize that the described method may be used to produce a leadless leadframe package (LLP) or quad-flat-pack-no-lead (QFN) package. However, many other package types, such as dual inline packages (DIPs) may be produced as well.

The described package 632 has both improved electrical performance as well as improved thermal performance while conforming to a desired package format such as LLP or QFN. Firstly, as those familiar with the art will appreciate, the solder joints 418 have much lower resistances than conventional bonding wires and enable significantly more thermal dissipation. Generally, as the number and diameter of the solder joints increase, the current carrying and heat dissipation capabilities increase. Additionally, as the diameters of the solder joints increase, the resistance through the solder joints decreases. As a result of their larger diameters and the relatively shorter distance traveled through a solder joint as compared to a typical bonding wire, the electrical resistance through solder ball joints is far below that of typical bonding wires. By way of example, a typical solder ball joint may have a resistance of approximately 0.5 mΩ while a corresponding bonding wire used in a similar application may have a resistance in the range of approximately 60 to 100 mΩ. Furthermore, the leads 308 provide an efficient mechanism for conducting thermal energy out of the die (via solder joints 418) and through the leads 208 (via solder joints 418) where it can be dissipated to a PCB.

The described arrangement of leadframe panels 200 and 300 are generally most widely applicable in packaging dice 420 having a lower number of I/O pads 424 arranged around the periphery of the active surface of the die 420 (i.e. packages having a low pin count). In embodiments in which the dice to be packaged have a larger number of I/O pads arranged in a grid over the active surface of the die, such as those illustrated in FIGS. 7A-B and 8A-B, it may be desirable to utilize a microarray style leadframe to interconnect the I/O pads with solder pad surfaces on a lower leadframe having a more conventional QFN arrangement of leads.

Figure 7A:
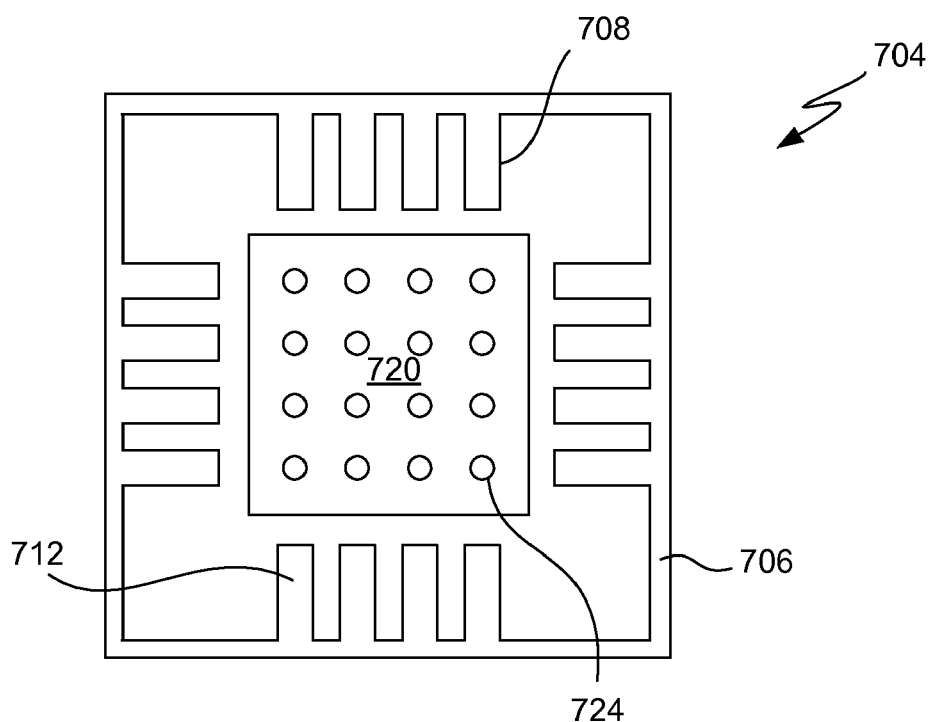
FIGS. 7A-B illustrate close-up top views of alternate leadframe device area arrangements during packaging of an IC die in accordance with another embodiment of the present invention.
Figure 7B:
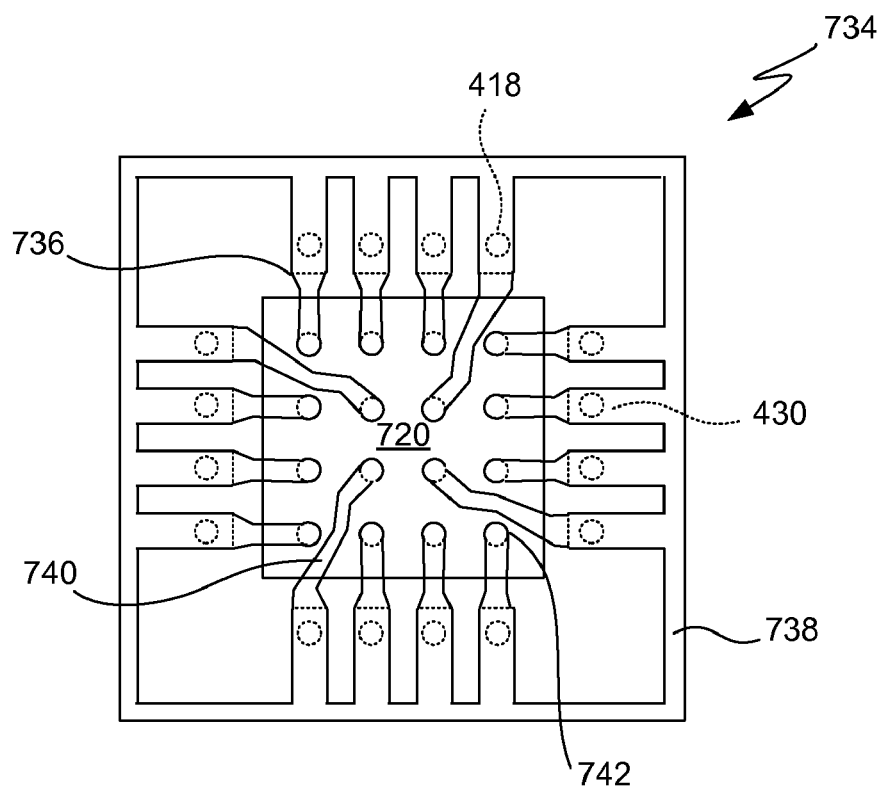

By way of example, FIG. 7A illustrates a close-up view of a QFN-type leadframe panel device area 704 having sixteen leads 708 arranged around four sides of a die attach area and supported by tie bars 706. As described above, each lead 708 includes a solder pad surface 712 on the top surface of the lead and a package contact surface on the bottom surface of the lead. A die 720 that includes sixteen I/O pads 724 is positioned within the die attach area 710. FIG. 7B illustrates a device area 734 from a microarray-type leadframe panel positioned over the die 720 and the bottom QFN-type leadframe panel device area 704.

Each microarray device area 734 has a number of leads 736, each supported at one end by tie bars 738. Each lead 736 includes a long lead trace 740 that terminates at a contact region 742 at the distal end of the lead (relative to the associated tie bar). Each contact region 742 has a solder pad surface on the bottom surface of the contact region. Each lead 736 also includes a solder pad surface on the bottom surface of the lead at a more proximal region of the lead. The lead traces 740 and associated contact regions 742 are arranged such that when the microarray leadframe device area 734 is positioned over and adjacent the QFN device area 704, the contact regions 742 are positioned over corresponding I/O pads 724. The microarray leads 736 are electrically connected with the die 720 and leads 708 by means of reflowing solder bumps to form solder joints between the solder pad surfaces on the leads 736 and the I/O pads 724 and solder pad surfaces 712 on the die and leads 708, respectively.

Figure 8A:
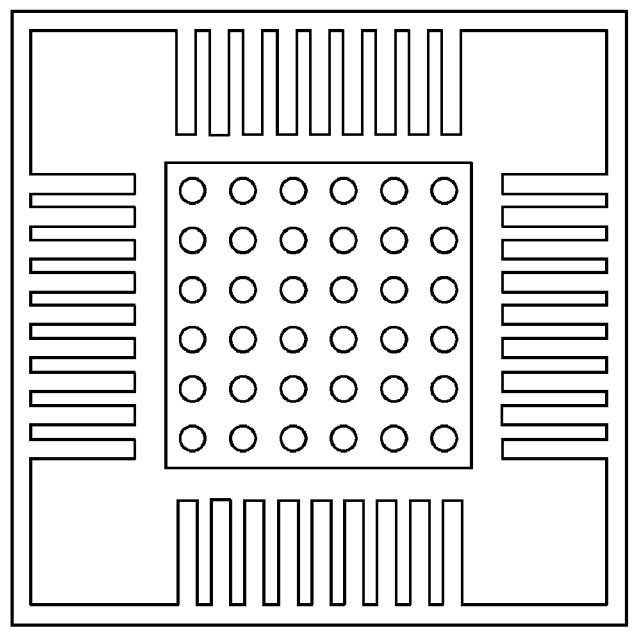
FIGS. 8A-B illustrate close-up top views of alternate leadframe device area arrangements during packaging of an IC die in accordance with another embodiment of the present invention.
Figure 8B:
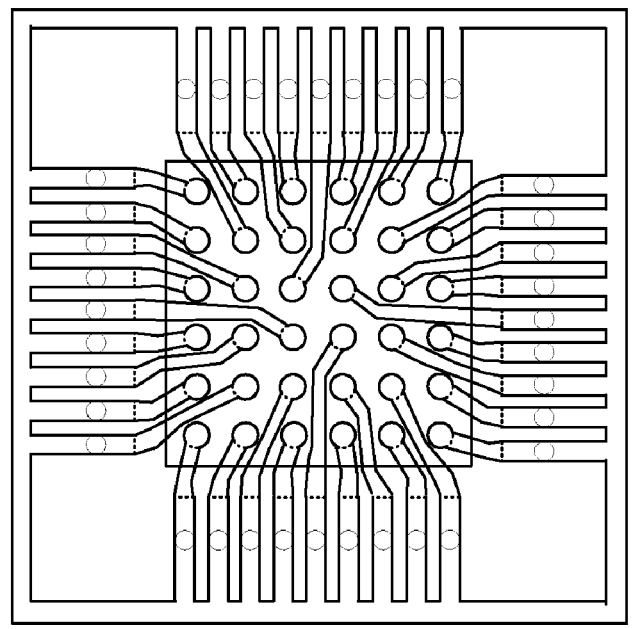

One notable advantage of using such a microarray type leadframe is the ability to connect the leads 708 to I/O pads 724 located within the inner region of the active surface of the die 720. This is due to the ability of the lead traces 740 to extend in between neighboring contact regions 742 and other lead traces 740. Generally, as the number of I/O pads 724 increases the more difficult it becomes to reach the I/O pads 724 at the inner region of the active surface of the die 720. Thus, the use of a microarray leadframe as the top leadframe becomes more advantageous. By way of example, FIGS. 8A and 8B illustrate the use of a top microarray leadframe in electrically routing thirty-six I/O pads arranged in a grid pattern on a die to thirty-six corresponding leads on a bottom QFN type leadframe.

Figure 9A:
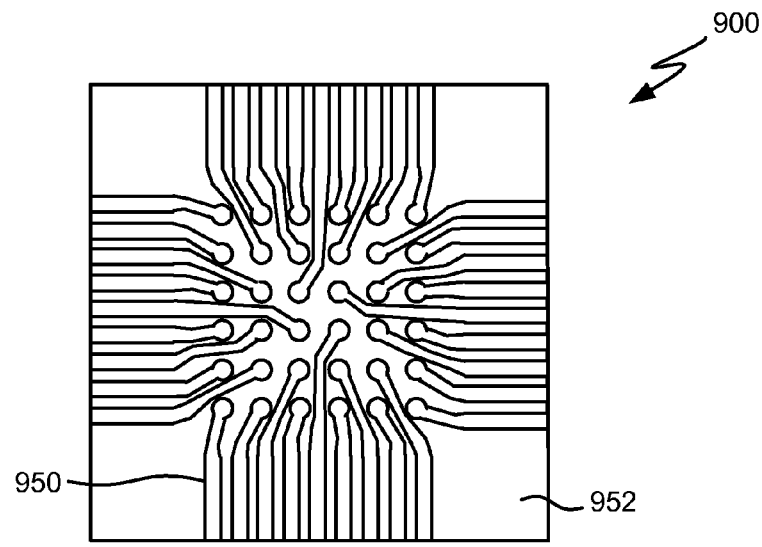
FIGS. 9A-C illustrate close-up top and side views of alternate device area arrangements during packaging of an IC die in accordance with various embodiments of the present invention.
Figure 9B:
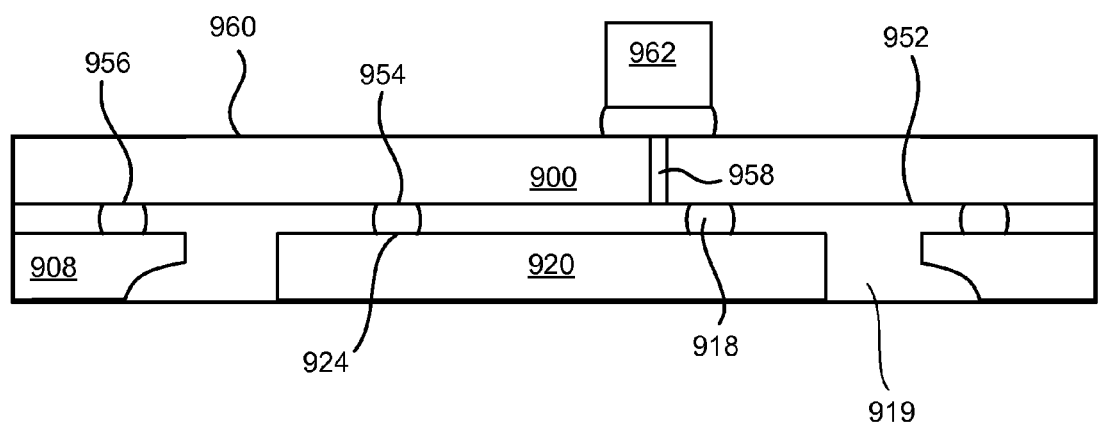

In still other embodiments, a substrate other than a leadframe may be used to electrically connect I/O pads on a die to corresponding leads on a bottom leadframe. By way of example, FIG. 9A illustrates a bottom view of a substrate 900 having a number of conductive traces 950 on the bottom surface 952 of the substrate. The traces are generally formed of an electrically conductive metal such as copper and may be formed by any suitable means. By way of example, the traces 950 may be formed by etching a metallic layer that has been deposited onto the bottom surface 952 of the substrate 900 or by electroplating the traces 950 onto the bottom surface of the substrate. The traces 950 are utilized as routing interconnects that electrically couple I/O pads 924 on a die 920 with corresponding leads 908 on a bottom leadframe. More specifically, each trace 950 includes an inner solder surface 954 that is electrically connected with an associated I/O pad 924 via an associated solder joint 918, as well as a peripheral solder surface 956 that is electrically connected with an associated lead 908 via an associated solder joint 918. Portions of the substrate 900, the die 920 and the leads 908 are encapsulated in a molding material 919.

The substrate 900 may also be formed from any suitable material. By way of example, in one embodiment the substrate 900 is formed from a ceramic such as a low-temperature co-fired ceramic (LTCC). In other embodiments, the substrate 900 may be formed from various plastics, polyimides, epoxy resins, Bismaleimide-Triazine (BT) resins and/or other insulting materials. The substrate 900 may also be constructed as a laminate structure having various electrically conductive interconnect routing layers disposed in between insulating layers in a fashion similar to that of a standard multilayer PCB.

Figure 9C:
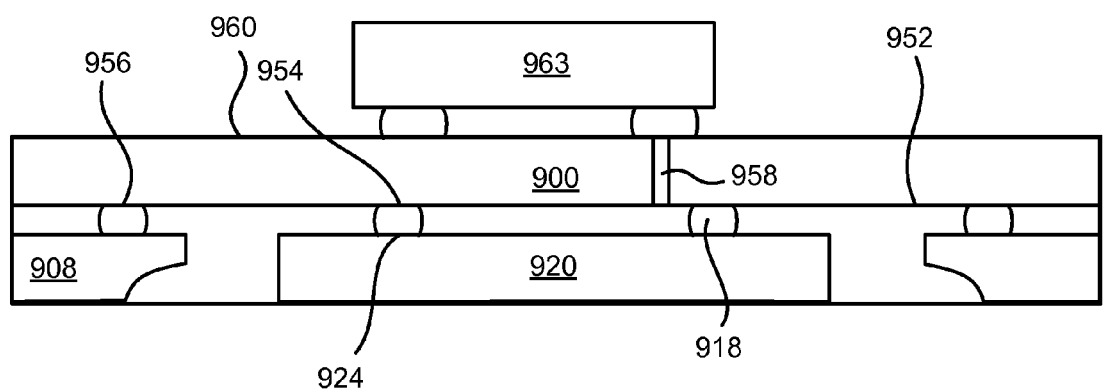

The use of such a substrate 900 having traces 950 enables the coupling of virtually any number and arrangement of I/O pads 924 with associated leads 908 on the bottom leadframe. More specifically, the traces 950 may be easily and inexpensively arranged in any desired pattern to match the arrangements of the I/O pads on the die and the leads on the bottom leadframe. Additionally, the substrate 900 may be configured with vias 958 that extend from various traces 950 up to the top surface 960 of the substrate 900. Such vias 958 facilitate the incorporation and electrical connection of passive elements 962 such as capacitors and resistors, for example, within the IC package as illustrated by the cross-sectional side view of FIG. 9B. In another embodiment, a second die may even be coupled to the top surface 960 of the substrate 900 rather than or in addition to the passive elements 962. One example of such an approach is illustrated in FIG. 9C, which shows a second die 963 coupled to the top surface 960 of the substrate 900. As such, the described arrangement is particularly useful in the production of system-in-package (SIP) devices.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed. It will be apparent to one of ordinary skill in the art that many modifications and variations are possible in view of the above teachings.

The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An integrated circuit package, comprising:
    an integrated circuit die, the die having an active surface and a back surface substantially opposite the active surface, the active surface including a plurality of I/O pads;
    a plurality of lower contact leads, each lower contact lead having a first solder-wettable surface and a second surface substantially opposite the first solder-wettable surface; and
    an insulating substrate having a plurality of electrically conducting upper routing traces formed on a bottom surface thereof, wherein ones of the traces have at least one inner solder-wettable portion and at least one peripheral solder-wettable portion, each inner solder-wettable portion being physically and electrically connected with an associated I/O pad with an associated solder joint, each peripheral solder-wettable portion being physically and electrically connected with an associated solder-wettable surface on a lower contact lead with an associated solder joint such that each trace electrically couples an associated I/O pad with an associated lower contact lead.

2. An integrated circuit package as recited in claim 1, wherein the substrate is formed from one of the group consisting of a plastic, a polyimide, an epoxy resin and a Bismaleimide-Triazine (BT) resin.

3. An integrated circuit package as recited in claim 1, wherein the substrate is formed from a ceramic.

4. An integrated circuit package as recited in claim 1, wherein the substrate is a laminate structure.

5. An integrated circuit package as recited in claim 1, further comprising at least one via that routes at least one of the traces to a top surface of the substrate.

6. An integrated circuit package as recited in claim 1, further comprising a passive component positioned on the top surface of the substrate and coupled with at least one trace on the bottom surface of the substrate.

7. An integrated circuit package as recited in claim 1, further comprising a molding material that encapsulates portions of the die, lower contact leads and the insulating substrate.

8. An integrated circuit package as recited in claim 1, wherein portions of the insulating substrate are exposed on an exterior of the integrated circuit package.

9. An integrated circuit package as recited in claim 1, wherein the upper routing traces are arranged into a microarray type arrangement.

10. An integrated circuit package as recited in claim 9, wherein each upper routing trace includes a trace portion connected with a contact potion, the contact portion being positioned adjacent an associated I/O pad on the die and wherein at least one trace portion extends between contact portions of neighboring upper routing traces.

11. An integrated circuit package, comprising:
    a first integrated circuit die, the die having an active surface and a back surface substantially opposite the active surface, the active surface including a plurality of I/O pads;
    a plurality of lower contact leads, each lower contact lead having a first solder-wettable surface and a second surface substantially opposite the first solder-wettable surface; and
    an insulating substrate having a plurality of electrically conducting upper routing traces formed on a bottom surface thereof, the bottom surface of the insulating substrate facing and covering at least substantially the entire active face of the first integrated circuit die, wherein each upper routing trace includes an inner solder-wettable portion and a peripheral solder-wettable portion, each inner solder-wettable portion being physically and electrically connected via an associated solder joint with an associated I/O pad, each peripheral solder-wettable portion being physically and electrically connected via an associated solder joint with an associated solder-wettable surface on a lower contact lead such that each upper routing trace electrically couples an associated I/O pad with an associated lower contact lead.

12. An integrated circuit package as recited in claim 11, further comprising a molding material that substantially encapsulates at least a portion of the first integrated circuit die and at least portions of the plurality of lower contact leads and the insulating substrate,
    wherein each of the plurality of upper routing traces on the insulating substrate includes a first surface and an opposing second surface, the second surface of the upper routing trace being in contact with the bottom surface of the insulating substrate, at least the majority of the first surface of the upper routing trace being in direct contact with the molding material.

13. An integrated circuit package as recited in claim 11, further comprising a second integrated circuit die that is mounted on a top surface of the insulating substrate that opposes the bottom surface thereof, the second integrated circuit die being electrically coupled with at least one of the plurality of upper routing traces formed on the bottom surface of the insulating substrate through a conductive via that extends through an opening in the insulating substrate.

14. An integrated circuit package as recited in claim 11, further comprising a passive element that is one of a group consisting of a resistor and a capacitor, the passive element being mounted on a top surface of the insulating substrate that opposes the bottom surface thereof, the passive element being electrically coupled with at least one of the plurality of upper routing traces formed on the bottom surface of the insulating substrate through a conductive via that extends through an opening in the insulating substrate.

15. An integrated circuit package as recited in claim 11, wherein:

each of the plurality of upper routing traces includes a trace portion connected to a contact portion, the contact portion being positioned adjacent an associated I/O pad on the first integrated circuit die;

the contact portions of the plurality of upper routing traces form a grid that includes at least an inner row of contact portions and an outer row of contact portions, the inner and outer rows each including at least two collinearally arranged contact portions, the inner row being closer to the center of the grid then the outer row;

the plurality of upper routing traces includes a first upper routing trace, a second upper routing trace and a third upper routing trace, the contact portion of the first upper routing trace being in the inner row of contact portions, the contact portions of the second and third upper routing traces being in the outer row of contact portions; and the trace portion of the first upper routing trace extends between the contact portions of the second and third upper routing traces, such that the trace portion of the first upper routing trace penetrates through the outer row of contact portions and connects to one of the inner row of contact portions.

\* \* \* \* \*